US005764506A

United States Patent [19]

Eynaud

[11] Patent Number: 5,764,506

[45] Date of Patent: Jun. 9, 1998

[54] METHOD AND APPARATUS FOR REDUCING THE SOUND LEVEL OF A MICROCOMPUTER

[76] Inventor: Bruno Eynaud, 45 Lotissement Plein Soleil, 05260 Saint Jean Saint Nicolas, France

[21] Appl. No.: 693,102

[22] PCT Filed: Jan. 31, 1995

[86] PCT No.: PCT/FR95/00111

§ 371 Date: Jul. 26, 1996

§ 102(e) Date: Jul. 26, 1996

[87] PCT Pub. No.: WO95/20786

PCT Pub. Date: Aug. 3, 1995

[30] Foreign Application Priority Data

Jan. 31, 1994 [FR] France .................................. 94 01778

[51] Int. Cl.[6] ........................................ G06F 1/20

[52] U.S. Cl. .............. 364/141; 395/750.03; 236/DIG. 8

[58] Field of Search .................................. 364/141, 557, 364/707; 395/750, 750.01–750.08; 361/695–697, 687; 236/49.3, DIG. 8, DIG. 9

[56] References Cited

U.S. PATENT DOCUMENTS

| | | | |
|---|---|---|---|
| 5,249,741 | 10/1993 | Ristline | 236/49.3 |
| 5,513,361 | 4/1996 | Young | 395/750 |
| 5,526,289 | 6/1996 | Dinh et al. | 364/557 |

FOREIGN PATENT DOCUMENTS

| | | | |
|---|---|---|---|
| 92 05 991 | 8/1992 | Germany | H02B 1/56 |
| 93 07 947 | 9/1993 | Germany | H02B 1/20 |
| 93 09 641 | 10/1993 | Germany | G06F 1/32 |
| 89 06012 | 6/1989 | WIPO | G06F 11/30 |

OTHER PUBLICATIONS

*Automatic Disk Power Reduction for Portable Computers*, IBM Technical Disclosure Bulletin, Vil. 32 4B Sep. 1989.

*Primary Examiner*—Reba I. Elmore

*Assistant Examiner*—Steven R. Garland

*Attorney, Agent, or Firm*—Wolf, Greenfield & Sacks P.C.

[57] ABSTRACT

The invention relates to apparatus for reducing sound nuisance and designed to be fitted easily to a microcomputer including, inter alia, a hard disk motor powered by a cable fitted with connectable male and female connectors, and a fan motor powered by a cable fitted with connectable male and female connectors. The sound level reducing apparatus comprises: a unit of a first type which is designed to be interposed between the male and female connectors of the disk motor power supply cable, which receives an operation request signal, and which causes the disk motor to be powered while the request signal is present and for a determined length of time thereafter, and a unit of a second type which is designed to be interposed between the male and female connectors of the fan motor power supply cable, which receives a temperature signal and which causes the fan motor to be powered only when the temperature is too high.

18 Claims, 6 Drawing Sheets

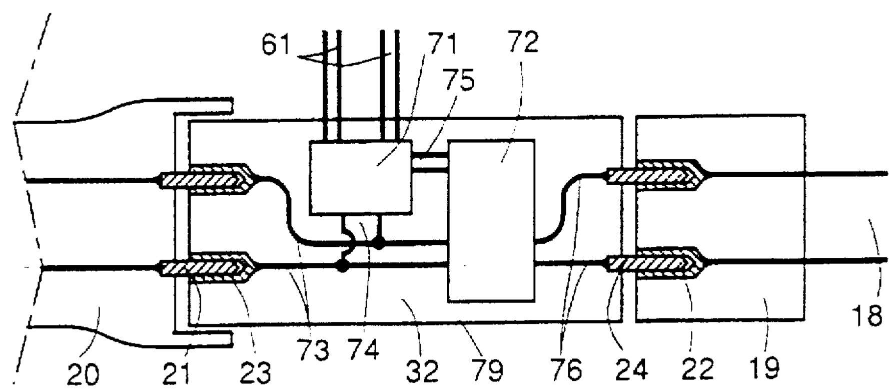
Fig. 5
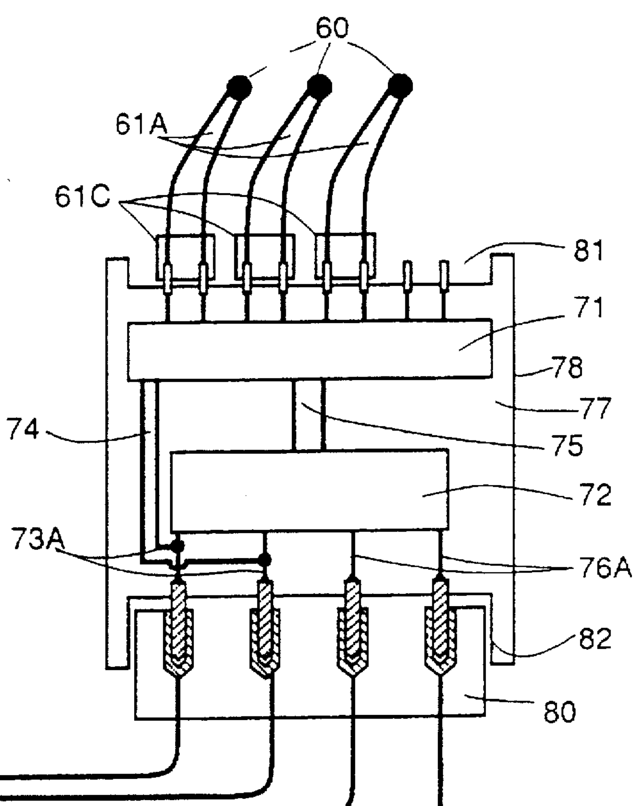
Fig. 6
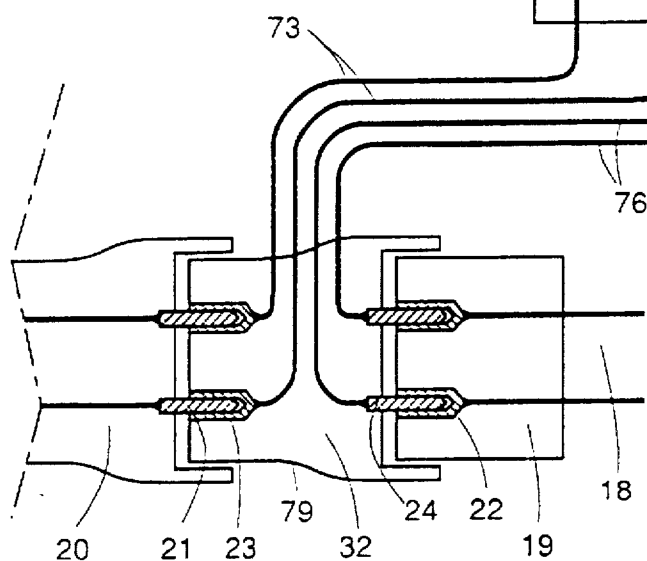

C x T must be greater than hard disk start-up time

METHOD AND APPARATUS FOR REDUCING THE SOUND LEVEL OF A MICROCOMPUTER

The present invention relates in general to apparatus for reducing the sound level of a microcomputer.

The term "microcomputer" is used below essentially to keep the text concise, but it must be understood that the term "microcomputer" covers any machine of the computer, calculator, workstation, specialized or game machine, or other type, providing the machine includes at least one microprocessor or at least one microprocessor and a rotating disk mass memory.

BACKGROUND OF THE INVENTION

The sound level of a modern microcomputer stems essentially from rotation of the microcomputer's hard disk and from rotation of the microcomputer's fan.

So long as microcomputers were machines used mainly by people acting as specialists or as technicians, such people considered their microcomputers as "professional" or "industrial" machines and it was not of prime importance to them that their machines be very quiet. However, modern microcomputers are becoming more and more commonplace appliances which may be present in a wide variety of locations, close to people whose professional preoccupations or leisure are not necessarily directly associated with continuous use of the microcomputer situated nearby. In practice, this means that there exist many situations in which a person is close to a modern microcomputer which is running, and the person is consciously or unconsciously subjected to the sound level of the microcomputer. The sound level of a modern microcomputer is relatively low, but because of the widespread use of microcomputers, there now exist many situations in which a person spends relatively long periods of time in premises where no object or appliance other than the microcomputer is generating a significant level of sound. Under such circumstances, the microcomputer is the only appliance generating significant noise and consequently that constitutes a nuisance that is becoming non-negligible.

Modern microcomputers, and more particularly most non-portable microcomputers, constitute an installed base of machines that has become relatively large. Even if it is assumed that these non-portable modern microcomputers, practically all of which generate a non-negligible level of sound, are machines of relatively short lifetime, that lifetime is nevertheless several years, and may be more than ten years. Consequently, it can be assumed that in spite of probable changes to non-portable microcomputers likely to lead to improvements that make future non-portable microcomputers quieter, the present installed base of modern non-portable microcomputers is large enough in itself to constitute a demand for apparatus that can easily be added to an existing non-portable microcomputer in order to make the microcomputer quieter.

The design of future microcomputers should include improvements designed to reduce the noise of the machine. A device of the present invention designed to reduce the sound level of a microcomputer is also suitable for inclusion in such future microcomputers, either when the machine is manufactured, or after it has been sold to an end user.

Technical solutions have already been proposed, in particular for modern portable microcomputers, that keep electrical energy consumption down as far as possible. For example, it is known that a system can be integrated in a portable microcomputer for stopping the rotary drive of a hard disk whenever the microcomputer is on standby while nevertheless being switched on. Until now, such systems have been intended mainly to provide electrical energy savings, and that is why such systems have been used solely for portable microcomputers that are battery powered, but it is indisputable that such systems have also served to reduce the sound level of a microcomputer whenever the microcomputer is on standby and its hard disk is no longer revolving. However, all of the technical solutions that have been adopted for such a system included in a portable microcomputer have been technical solutions requiring a hard disk motor drive control circuit to be integrated within one of the electronics cards of the microcomputer, with the consequence that said circuit has always been an integral part of the microcomputer and has always been put into place during manufacture of the microcomputer. Consequently, such a circuit, as provided at present, is unsuitable for being added easily to an existing microcomputer for the purpose of providing it with the facility of reducing sound level by conditionally stopping rotation of the hard disk.

Other technical solutions have already been proposed, for regulating the internal temperature of the machine, in particular of a mini-computer or a modern microcomputer. For example, it is known that a system can be integrated in a computer to switch a fan motor on or off, and/or to drive it at a modulated speed, for the purpose of matching the ventilation flow rate to the mean internal temperature of the machine. Until now, such a system has been intended mainly to prevent at least one of the internal components of the machine becoming excessively hot, but it is undeniable that such a system also has the effect of reducing the sound level of the computer whenever the computer is in a condition where its ventilation is set low or is switched off thereby. However, all of the technical solutions which have been adopted for such a system included in a computer have been technical solutions that require a fan motor drive control circuit to be integrated in one of the electronics cards of the computer, itself located inside a box mechanically assembled to the microcomputer, and as a result such a circuit has always been an integral part of the computer and has always been put into place during manufacture of the computer. Consequently, such a circuit is unsuitable for being easily added to an existing microcomputer (if only because fixing points are not standardized) so as to provide the computer with a facility for lowering sound level by conditionally stopping fan rotation and/or a facility for regulating temperature.

Also, in certain known temperature regulation systems, the temperature sensor is disposed in the outgoing air flow, i.e. in the flow of air that has passed over most of the components of the machine, thereby making it possible to obtain an overall estimate of machine heating. Although such an overall estimate has been satisfactory for a long time, it is no longer satisfactory for the following reasons. Modern microcomputers or computers are of an "open" type of architecture, i.e. they are machines which contain a certain number of internal electronics cards on manufacture, but which also contain a certain number of empty slots for receiving additional electronics cards at a later date for the purpose of subsequently providing the machine with increased capacity or with certain new facilities that were not provided initially. As a result, in modern microcomputers, the conventional temperature regulation system of the kind described above can be well adapted to an initial configuration of the machine but can turn out to be ill-adapted after a new, different electronics card has been added inside the machine. The new electronics card need not necessarily have been designed by the manufacturer of the initial machine and it may include electronic components whose heating can be locally in excess of a threshold considered as dangerous. In addition, such additional electronics cards are designed to be capable of being added equally well to various kinds of microcomputer, so it is not always possible to be certain that a given additional electronics card will behave in the same manner with respect to heating of at least one of its electronic components when the card is installed in a microcomputer of one kind or in a microcomputer of another kind, and that constitutes a major drawback from the point of view of operating reliability for such modern microcomputers having "open" type architecture.

In order to forestall this potential risk, such known temperature regulation systems must operate with a large safety margin and thus with poor efficiency in respect of reducing sound nuisance.

In other known temperature regulation systems, a temperature sensor is located close or directly on a component that is likely to heat up. So long as the temperature detected by the sensor is below a certain threshold, the fan does not operate or operates at reduced speed, and as soon as the temperature dictated by the sensor exceeds the threshold, the fan operates at high speed.

If the predetermined threshold is high (situated close to the limit temperature that the component can physically accept), then the fan must increase speed very considerably when the threshold is exceeded in order to attempt to cool down the component very vigorously before it is damaged. That means that the fan must be overdimensioned so as to be capable (on rare occasions) of delivering very great cooling power, which is a drawback from the point of view of cost and from the point of view of the high noise that may occur (albeit rarely). Psychologically and physiologically, a very loud noise that happens only rarely is perceived as a major nuisance.

If the predetermined threshold is low (situated well below the limit temperature that is physically acceptable by the component), then the fan can be designed to be of small dimensions so as to operate at a relatively low maximum speed since the component will be cooled sooner, in anticipation. However, the fan will operate very often, e.g. several times per minute or per hour. As a result, the fan frequently and suddenly changes speed and thus sound level, and that too creates a major sound nuisance. Psychologically and physiologically, a noise of low level, but that occurs frequently, is perceived as being a major nuisance.

It may be observed that under such circumstances, an increase in operating regularity can be obtained only by making the slow speed faster so as to enable it to keep the component at a low temperature, and thus also increasing the baseline sound level.

It is thus necessary to choose between:

- occasional very intense noise that appears suddenly in silence (in which case the components are subjected to large thermal stresses and the user is subjected to large psychological and physiological stresses);
- increases in noise that are more moderate (although clearly perceptible) and frequent (thus frequently catching the user's attention which interferes with continuous concentration); and
- a noise level that is more regular and higher than in the preceding case (which noise, if nearly constant and greater than 50 dB, will, according to known medical studies, give rise insidiously to and will maintain generalized fatigue in the user by a physiological accumulation effect).

OBJECTS AND SUMMARY OF THE INVENTION

An object of the present invention consists in proposing novel apparatus for reducing the sound level of an existing microcomputer.

Another object of the invention consists in proposing such apparatus that is also suitable for being easily installed in a wide variety of existing microcomputers made by different manufacturers.

Another object of the invention consists in proposing such apparatus that also makes it possible to increase the reliability of an existing microcomputer by improving its cooling system, said improvement in the cooling system being a direct result of the novel operation of the apparatus.

Another object of the invention consists in proposing such apparatus that also makes it possible to reduce the energy consumption of an existing microcomputer.

The invention provides a method of reducing the sound level of a microcomputer, the microcomputer including, inter alia:

at least one fan rotated by a fan motor, at least one component that gives off heat at a rate that varies as a function of the operating conditions of the component, a first power supply for electrically powering the fan motor, a first electric cable connecting the first power supply to the fan motor either directly or via both a first connection element and a second connection element releasably engageable with the first connection element and connected to the fan motor;

the method comprising the following steps:

a) providing at least one unit of a first type including input and output contacts, suitable for being connected in releasable and interposed manner either to the first cable or between the first connection element and the second connection element and which includes:

- a first power supply modulator circuit controlled as a function of an input signal so as to interrupt, establish, or modulate in selective manner the power supply to the fan motor via certain input contacts and output contacts of the unit of the first type; and
- a first control circuit which is continuously powered by the first power supply via the input contacts of the unit of the first type, which receives, via at least one temperature signal cable, at least one temperature signal produced by at least one sensor situated at a certain distance from said at least one component that gives off heat, and which produces as an output said control signal for controlling the first power supply modulator circuit so that the control signal:
  - either causes the fan motor to be powered when said at least one temperature signal is in a state indicative of excessive temperature and causes the power supply to the fan motor to be interrupted or reduced when said at least one temperature signal is in a state indicative of non-excessive temperature;
  - or else modulates the power supply to the fan motor in application of a predetermined mathematical relationship as a function of the at least one temperature signal;

b) connecting the at least one unit of the first type to the at least one first cable by sectioning it in full or in part, or connecting the unit of the first type between the first and second connection elements; and c) placing in the microcomputer said at least one temperature sensor for said unit of the first type.

In an implementation, said step c) of positioning said at least one first temperature sensor consists in positioning said at least one temperature sensor upstream from said at least one component that gives off heat in the flow direction obtained by natural convection or by non-adjacent forced ventilation of air for cooling the component, the distance between said first sensor and said component lying in the range 5 mm to 20 mm.

In another implementation, said step c) of positioning said at least one first temperature sensor consists in positioning said at least one temperature sensor upstream from said at least one component that gives off heat in the flow direction obtained by forced ventilation of cooling air for the component caused by an adjacent fan organized specifically for said component and situated very close thereto, the distance between said first sensor and said adjacent fan lying in the range 0 to 10 mm.

In another implementation, said step c) of positioning said at least one temperature sensor consists in further positioning another temperature sensor in the flow of cooling air at the location where said air leaves the microcomputer after sweeping over a set of components of the microcomputer and thus after being heated by receiving heat that has been accumulated by said set of components.

In another implementation, one of said fans is controlled in such a manner as to increase its speed when said first sensor detects a temperature greater than a first predetermined threshold OR when said other sensor detects a temperature greater than another predetermined threshold, said "OR" condition being a logical inclusive-OR function.

In another implementation, in which said microcomputer further includes, inter alia:

at least one hard disk rotated by a disk motor, at least one electrical circuit including at least one output terminal producing a disk operation request signal, a second power supply for electrically powering the motor of the hard disk, a third electrical cable connecting the second power supply to the disk motor either directly or via both a third connection element and a fourth connection element releasably engageable with the third connection element and connected to the disk motor;

said step a) further comprises:

providing at least one unit of a second type including input and output contacts suitable for being connected in releasable and interposed manner either to the second cable or between the third connection element and the fourth connection element and which includes:

- a second power supply modulator circuit controlled as a function of a control signal so as to interrupt, establish, or modulate in selective manner the electrical power supply for the disk motor via certain input and output contacts of the unit of the second type; and
- a second control circuit which is continuously powered by the second power supply via the input contacts of the unit of the second type, which receives an operation request signal via an operation request signal cable and which outputs said control signal to control the second power supply modulator component in such a manner that the control signal causes the disk motor to be powered throughout all the time the operation request signal is in a state indicative of an operation request, and causes the power supply to the disk motor to be interrupted or reduced when the operation request signal has remained in a state indicative of absence of an operation request for a length of time that exceeds a predetermined value, that is user or automatically adjustable; and the method further includes the following steps:

d) connecting the at least one unit of the second type to the at least one second cable by sectioning said cable completely or in part, or connecting said unit of the second type between the third and fourth connection elements; and e) engaging the at least one operation request signal connector for the at least one unit of the second type.

In another aspect, the invention provides apparatus for reducing the sound level of a microcomputer, the microcomputer including, inter alia:

at least one fan rotated by a fan motor, at least one component that gives off heat at a rate that varies as a function of the operating conditions of the component, a first power supply for electrically powering the fan motor, a first electric cable connecting the first power supply to the fan motor either directly or via both a first connection element and a second connection element releasably engageable with the first connection element and connected to the fan motor;

the apparatus comprising:

at least one unit of a first type including input and output contacts, suitable for being connected in releasable and interposed manner either to the first cable or between the first connection element and the second connection element and which includes:

- a first power supply modulator circuit controlled as a function of an input signal so as to interrupt, establish, or modulate in selective manner the power supply to the fan motor via certain input contacts and output contacts of the unit of the first type; and
- a first control circuit which is continuously powered by the first power supply via the input contacts of the unit of the first type, which receives, via at least one temperature signal cable, at least one temperature signal produced by at least one sensor situated at a certain distance from said at least one component that gives off heat, and which produces as an output said control signal for controlling the first power supply modulator circuit so that the control signal:
  - either causes the fan motor to be powered when said at least one temperature signal is in a state indicative of excessive temperature and causes the power supply to the fan motor to be interrupted or reduced when said at least one temperature signal is in a state indicative of non-excessive temperature;
  - or else modulates the power supply to the fan motor in application of a predetermined mathematical relationship as a function of the at least one temperature signal;

said at least one unit of the first type being for connection to the at least one first cable by sectioning it in full or in part, or for connection between the first and second connection elements; and said at least one temperature sensor for said unit of the first type being for installation in said microcomputer.

In another embodiment, said at least one first temperature sensor is positioned upstream from said at least one component that gives off heat in the flow direction obtained by natural convection or by non-adjacent forced ventilation of air for cooling the component, the distance between said first sensor and said component lying in the range 5 mm to 20 mm.

In another embodiment, said at least one first temperature sensor is positioned upstream from said at least one component that gives off heat in the flow direction obtained by forced ventilation of cooling air for the component caused by an adjacent fan organized specifically for said component and situated very close thereto, the distance between said first sensor and said adjacent fan lying in the range 0 to 10 mm.

In another embodiment, another temperature sensor is positioned in the flow of cooling air at the location where said air leaves the microcomputer after sweeping over a set of components of the microcomputer and thus after being heated by receiving heat that has been accumulated by said set of components.

In another embodiment, one of said fans is controlled in such a manner as to increase its speed when said first sensor detects a temperature greater than a first predetermined threshold OR when said other sensor detects a temperature greater than another predetermined threshold, said "OR" condition being a logical inclusive-OR function.

In another embodiment, said microcomputer further includes, inter alia:

at least one hard disk rotated by a disk motor, at least one electrical circuit including at least one output terminal producing a disk operation request signal, a second power supply for electrically powering the motor of the hard disk, a third electrical cable connecting the second power supply to the disk motor either directly or via both a third connection element and a fourth connection element releasably engageable with the third connection element and connected to the disk motor;

the apparatus further comprising:

at least one unit of a second type including input and output contacts suitable for being connected in releasable and interposed manner either to the second cable or between the third connection element and the fourth connection element and which includes:

- a second power supply modulator circuit controlled as a function of a control signal so as to interrupt, establish, or modulate in selective manner the electrical power supply for the disk motor via certain input and output contacts of the unit of the second type; and
- a second control circuit which is continuously powered by the second power supply via the input contacts of the unit of the second type, which receives an operation request signal via an operation request signal cable and which outputs said control signal to control the second power supply modulator component in such a manner that the control signal causes the disk motor to be powered throughout all the time the operation request signal is in a state indicative of an operation request, and causes the power supply to the disk motor to be interrupted or reduced when the operation request signal has remained in a state indicative of absence of an operation request for a length of time that exceeds a predetermined value, that is user or automatically adjustable; and the at least one unit of the second type is being connected to the at least one second cable by sectioning said cable completely or in part, or being connected between the third and fourth connection elements.

In another embodiment, said second control circuit receives said operation request signal via said operation request signal cable and via a connector connectable to a connection element initially existing in the microcomputer.

In another embodiment, at least one of said units of the second type and at least one of said units of the first type are disposed in a single package to constitute said apparatus in the form of a kit designed to be used to reduce the sound level of a microcomputer.

In another embodiment, said unit of the second type or its set of connectors is disposed in a plurality of models in said single package, said models differing from one another by the configurations of said input and output contacts, whereby said plurality of models covers a plurality of different possible standard types of said third and fourth connection elements.

In another embodiment, said unit of the first type or its set of connectors is disposed in a plurality of models in said single package, said models differing from one another by the configurations of said input and output contacts, whereby said plurality of models covers a plurality of different possible standard types of said first and second connection elements.

In another embodiment, said unit of the second type is implemented as a molded plastics housing supporting said input and output contacts on two respective opposite faces and simultaneously enclosing said second power supply modulator circuit, said second control circuit, and the various electrical connections established between said components and said input and output contacts.

In another embodiment, said unit of the first type is implemented as a molded plastics housing supporting said input and output contacts on two respective opposite faces and simultaneously enclosing said first power supply modulator circuit, said first control circuit, and the various electrical connections established between said components and said input and output contacts.

BRIEF DESCRIPTION OF THE DRAWINGS

These objects, characteristics, and advantages, and others of the present invention will be better understood from the following detailed description of an embodiment and illustrated by the accompanying figures, in which:

FIG. 5 is a simplified section view of an embodiment of a second essential element (type 2 unit) of the apparatus of the present invention;

FIG. 6 is a view similar to FIG. 5 showing a variant embodiment of the second essential element (type 2 unit) of apparatus of the present invention;

MORE DETAILED DESCRIPTION

Figure 1:
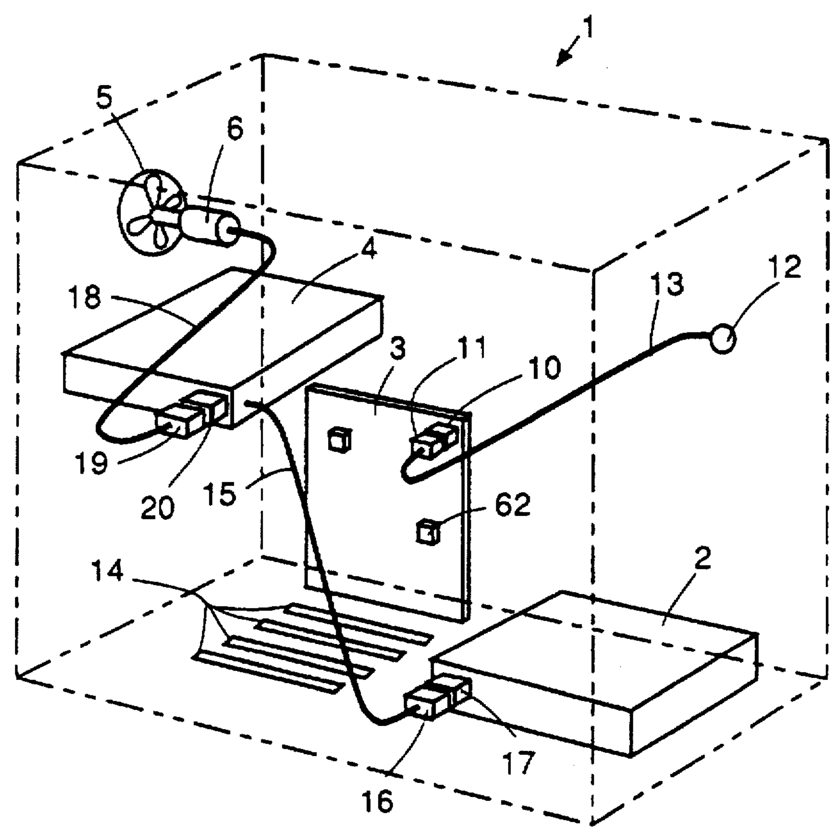
FIG. 1 is a simplified general view in perspective of the known essential elements of a modern prior art microcomputer.

FIG. 1 is a diagrammatic and fragmentary view of an existing modern microcomputer 1. More precisely, there can be seen in chain-dotted lines the parallelepipedal outline of such a microcomputer. Inside, the microcomputer 1 includes a large-number of conventional elements which are not described herein for reasons of simplification, but it is appropriate to mention that such conventional elements include certain elements that need to be taken into consideration to understand the invention. These elements include a hard disk unit 2 which conventionally comprises a hard disk (not shown) and a hard disk drive motor (not shown), an electronics card 3, a power supply 4, a fan 5, and a fan motor 6. The electronics card 3 includes, inter alia, a male connector 10 which be connected to a female connector 11 which is connected to a light-emitting diode (LED) 12 via a cable 13. An electrical signal is applied to the pins of the connector 10 and is transmitted via the connector 11 and the cable 13 to the LED 12. This electrical signal constitutes a hard disk operation request signal. In other words, when the electronics card 3 seeks to access information contained on the hard disk 2, it issues a hard disk operation request signal so as to light up the LED 12 and simultaneously start a process whereby information is communicated between the card 3 and the hard disk 2. Whenever the LED 12 is on, it serves to inform a user that the hard disk 2 is in use. In fact, there generally exists more than one electronics card 3, but only one is shown herein for reasons of simplification, and there exist other connectors or "slots" for receiving other electronics cards which may be of various types and which are intended for subsequent connection, being housed inside the microcomputer for the purpose of changing its facilities or increasing its performance. Such additional add-in electronics cards are not shown herein for reasons for simplification. Nevertheless, reference 14 designates a plurality of slot connectors for receiving such additional cards. The power supply 4 feeds electrical power to the hard disk 2 via a cable 15 whose free end is connected to a female connector 16 suitable for connection to a male connector 17 connected to the hard disk 2. In similar manner, the power supply 4 feeds electrical power to the fan motor 6 via a cable 18 whose free end is connected to a female connector 19 connectable to a male connector 20 which is directly connected to a printed circuit (not shown) off the power supply 4.

The electronics card 3 and the other electronics cards which are present in the microcomputer or the additional electronics cards that may be added subsequently, generally include a certain number of electronic components or electrical devices which give off heat at a rate that varies as a function of the operating conditions of such components. By way of example, and for reasons of simplification, only one such electronic component is shown and is given reference 62. Naturally, other elements or other devices present in the computer, but not installed on electronics cards 3, could also constitute sources of heat, such as the power supply 4, for example. In such an existing modern microcomputer 1, the fan 5 and the hard disk 2 are generally both rotated continuously throughout the time the microcomputer is switched on. Consequently, and in practice, such a microcomputer 1 has only two noise sources, namely the fan 5 and the hard disk 2. Generally all of the other devices contained in the microcomputer are static and generate practically no noise. The apparatus of the present invention is intended to be easily added to such an existing modern microcomputer 1 so as to be able to make such a microcomputer silent for most of the time during which the microcomputer is switched on. Such a microcomputer 1 is generally used in a manner which can be very episodic during a day, yet it remains switched on practically throughout the day or at least for several hours for reasons that relate essentially to the fact that it is harmful to switch a microcomputer on and off too frequently, and also there can be a relatively long wait each time the computer is switched on. However, it happens very frequently and more and more frequently that such a microcomputer 1 operates statistically during relatively little time compared with the total time during which it is switched on, and even during the small amount of time when it is performing useful work, the time during which it needs to have the hard disk in actual operation is even shorter. Also, the fan 5 is generally continuously in operation in such an existing modern microcomputer 1, whereas running it at maximum rate is, in reality, superfluous throughout the major fraction of the time during which the microcomputer is switched on.

Figure 2:
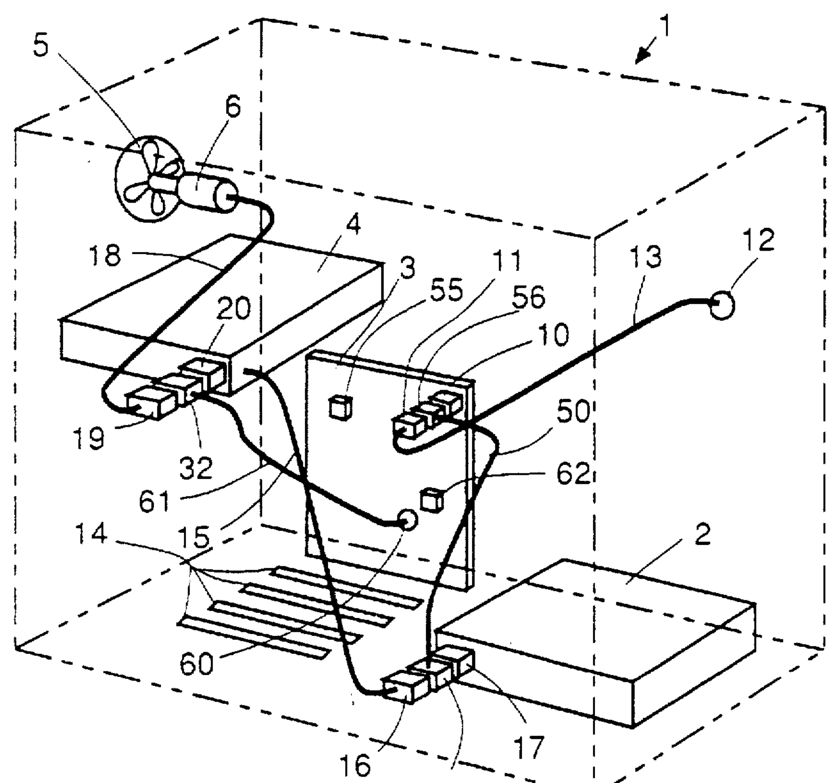
FIG. 2 is a view similar to FIG. 1 showing the same microcomputer, but in which apparatus of the present invention has been added.

The apparatus of the present invention, optionally organized as a kit, is essentially constituted by units of two types, n units of a type 1 and p units of a type 2 ($n \geqq 1$ and $p \geqq 1$). The apparatus of the present invention is described below with reference to FIG. 2 which shows the case of apparatus including only one type 1 unit and only one type 2 unit. FIG. 2 shows the same existing modern microcomputer 1 as that described with reference to FIG. 1. The apparatus of the present invention comprises a certain number of elements which are generally collected together as a kit, the kit being intended to be made available to a user of such a microcomputer 1 or to a professional involved in dealing in or maintaining such microcomputer 1. The kit can be added by any of those people to an existing modern microcomputer 1 for the purpose of making it much quieter. The kit also makes it possible to improve the operating reliability of such a microcomputer 1, as explained below.

In FIG. 2, the apparatus of the present invention, whether or not organized as a kit, is essentially constituted by one type 1 unit and one type 2 unit. A type 1 unit is designed to be connected in releasable and interposed manner either to the cable 15, or between the female connector 16 and the male connector 17 as described above for controlling the hard disk motor. The type 2 unit is designed to be connected in releasable and interposed manner either to the cable 18 or between the female connector 19 and the male connector 20 for controlling the fan motor.

A first embodiment may be one in which the type 1 unit forms an extender plug 31 which connects between the female connector 16 and the male connector 17, and in which the type 2 unit is an extender plug 32 which connects between the female connector 19 and the male connector 20. In other words, a person desiring to make an existing modern microcomputer 1 quieter and more reliable begins by opening one or more microcomputer covers to gain access to the inside, and then disconnects the male and female connectors 16 and 17 that are normally connected together, interposing between them the extender plug 31 and reconnecting the assembly constituted in this way, and then the information plug 56 is inserted between the female connector 11 and the male connector 10, after which similar operations are performed to connect the extender plug 32 between the female and male connectors 19 and 20, and to position and fix the temperature sensor(s) 60 located at the end(s) of the cable(s) 61. The structure and the operation of the extender plug 31 and the structure and the operation of the other extender plug 32 are described and explained below with reference to FIGS. 3 to 6.

Figure 3:
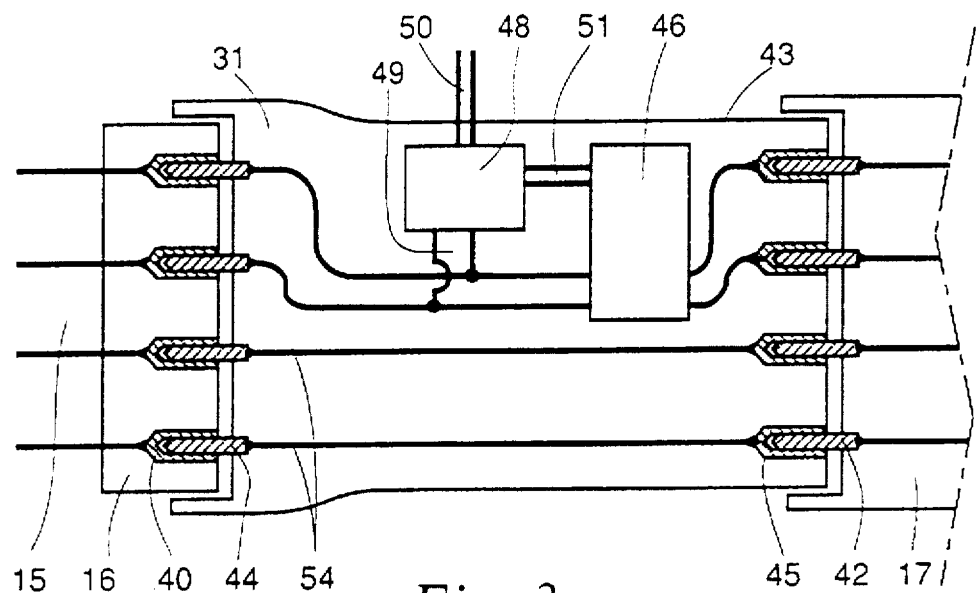
FIG. 3 is a simplified section view of an embodiment of a first essential element (type 1 unit) of the apparatus of the present invention.

In FIG. 3, there can be seen an embodiment of the extender plug 31 which is connected between the female connector 16 and the male connector 17. The female connector 16 at the end of the cable 15 that comes from the power supply 4 has a certain number of female contacts 40 which may be as low as two, but which is often a larger number. The male connector 17 is connected directly to a printed circuit (not shown) for controlling the drive motor of the hard disk 2 (not shown), and said male connector 17 has-male contacts 42 which may be as few as two in number, but which are often more numerous. When the microcomputer 1 is initially organized in conventional manner, i.e. without the apparatus of the present invention being added thereto, the female connector 16 is directly connected to the male connector 17 in such a manner that the female contacts 40 receive corresponding respective male contacts 42. When the user adds apparatus of the present invention to the microcomputer 1, the connectors 16 and 17 are disconnected and the extender plug 31 is interposed between them. The extender plug 31 is generally in the form of a housing of plastics material 43 which has male contacts 44 on one face and female contacts 45 on the opposite face. It will thus be understood that it is easy to connect the female connector 16, the extender plug 31, and the male connector 17 in series. The housing 43 of the extender plug 31 includes a power supply modulator circuit 46 which may be an on/off switch, or an on/nearly off switch, or an analog voltage controller, or a controllable DC/DC converter, etc. The power supply present on at least two male contacts 44 connected to electrical connections 52 is transmitted or converted via electrical connections 53 to the corresponding female connectors 45 via the power supply modulator circuit 46. The other male contacts 44, if any, are connected directly via the electrical connections 54 to the corresponding female contacts 45. In a practical embodiment, the power supply modulator circuit 46 may be implemented by using an electromechanical relay or, preferably, by using one or more active electronic components such as power transistors. The extender plug 31 also includes a control circuit 48 which is continuously powered electrically via electrical connections 49 connected to the electrical connections 52. Since the cable 15 comes from an electrical power supply 4 (described above), the electrical potential that is continuously present between some of the conductors of the cable 15 throughout the time the microcomputer 1 is switched on is transmitted to the control circuit 48 via the female contacts 40, the male contacts 44, and the electrical connections 52 and 49. Consequently, throughout the time the microcomputer 1 is switched on, the control circuit 48 is powered and it can operate normally. Another cable 50 is also connected to the control circuit 48, and the control circuit 48 is also connected via a connection 51 to the power supply modulator circuit 46 in order to control it. Referring again to FIG. 2, it can be seen that the cable 50 which serves to bring the hard disk operation request signal to the control circuit 48 of the extender plug 31 is a cable which includes an extender plug 56 at its end remote from the extender plug 31. This extender plug 56 is designed to be interposed between the female connector 11 and the male connector 10 (described above) which are normally connected together to enable the LED 12 to be powered.

The extender plug 31 operates in the manner described below with reference both to FIG. 2 and to FIG. 3. When the microcomputer 1 is on, the electronics card 3 is in operation and at some particular instant in its operation the electronics card 3 needs to exchange information with the hard disk 2, and to do that it issues an electrical signal via its connector 10 to request operation of the hard disk. An electrical link is established between this connector 10 and the extender plug 31, with this connection making use of the above-described cable 50. Consequently, the control circuit 48 receives such a hard disk operation request signal via the cable 50 and responds by producing a signal which is delivered via connection 51 to control the power supply modulator circuit 46 so as to establish a conducting condition and thus allow electricity from the power supply 4 to travel via the cable 15 and the electrical connections 52 and 53 to the motor of the hard disk so as to cause the hard disk to rotate.

Thereafter, the control circuit 48 causes the motor of the hard disk 2 to continue to be powered until a stop time-out period has expired. When the signal transmitted by the cable 50 corresponds to a hard disk operation request, the stop time-out is interrupted and reinitialized to a value that is predetermined or adjustable by the user or that is automatically adjustable. When the stop time-out expires, the motor of the hard disk is brought to a complete stop or to a low speed either progressively or suddenly.

Figure 7:
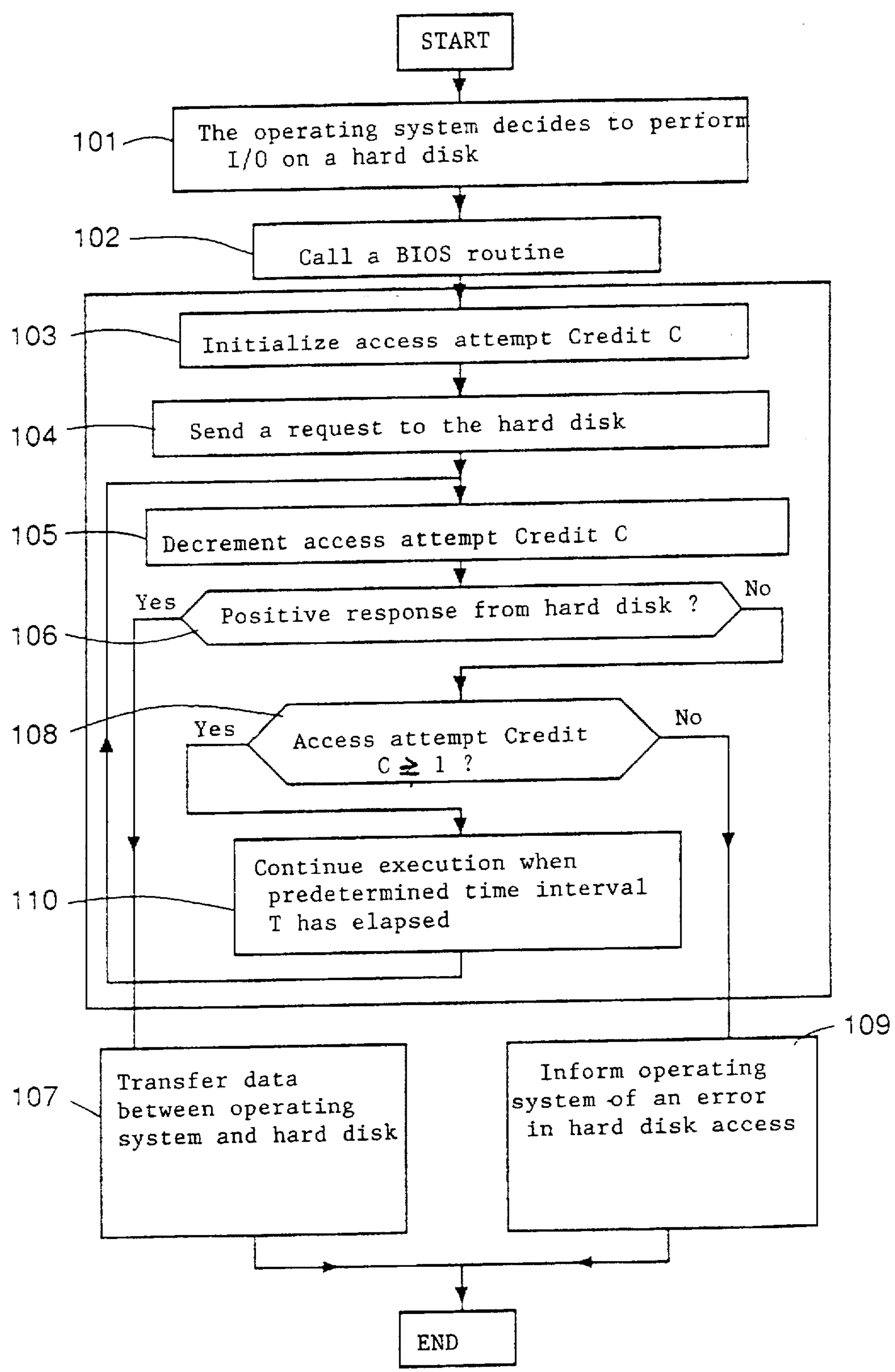
FIG. 7 is a flow chart showing the operation of a subroutine usable in the microcomputer in which apparatus of the present invention is installed for the purpose of improving operation thereof.

In a variant embodiment, control of the power supply to the motor of the hard disk 2 is associated with a particular input/output (I/O) mode that is more sophisticated, as shown in the flow chart of FIG. 7. In the flow chart, it should be specified that the term "BIOS" designates a resident program which is generally contained in a non-volatile memory (ROM) (reference 55 in FIGS. 1 and 2), which program serves to control interactions between the operating system of the microcomputer 1 and the hardware constituting the microcomputer. A modern microcomputer 1 generally contains a BIOS which is stored in a ROM 55, however the BIOS can be replaced by a specific BIOS for implementing the particular mode of operation shown in the flow chart of FIG. 7 when the apparatus of the present invention is added to an existing microcomputer 1. To replace the initial BIOS with a new, specific BIOS, the kit which includes the units of type 1 and of type 2 may further include a new BIOS ROM which can easily be used to replace the BIOS ROM 55 initially provided in the existing microcomputer 1, with this operation being simplified by the fact that BIOS-containing ROMs are generally connected in releasable manner on appropriate connectors which are themselves soldered to the electronics cards contained in microcomputers.

It is also possible to envisage adding routines by software in order to add to the functions of the existing BIOS without taking physical action of the component-replacing type.

In the flow chart, there can be seen a microcomputer program beginning with a condition in which "the operating system decides to perform I/O on a hard disk" (step 101). Thereafter, it performs a "call to a BIOS routine" (step 102). Thereafter it "initialize access attempt credit C" (step 103). Thereafter it "sends a request to the hard disk" (step 104). Thereafter it "decrements the access attempt credit C" (step 105). Thereafter, it asks the question "is the hard disk responding positively?" (step 106); if the answer is "yes", it then moves on to an instruction "transfer data between the operating system and the hard disk" (step 107) and then to the end; if the answer is "no", it moves on to the question "is the access attempt credit C greater than or equal to 1?" (step 108); if the answer is "no", it goes to a message instruction "indicate a hard disk access error" (step 109) followed by end; and if the answer is "yes", it "continues execution after a predetermined time interval T has elapsed" (step 110) and then returns to the instruction "decrement access attempt credit C" (step 105). It should be specified that the following condition must be satisfied:

$$C \times T \geqq \text{hard disk start-up time.}$$

FIG. 5 shows an embodiment of the extender plug 32 which is connected between the male connector 20 and female connector 19. The internal structure of the extender plug 32 is similar to that of the extender plug 31. Consequently, the extender plug 32 comprises, in similar manner, a housing 79 enclosing female contacts 23, male contacts 24, a power supply modulator circuit 72, and a control circuit 71. As can be seen in FIG. 2, the extender plug 32 is connected between the connectors 19 and 20 so that the power supply modulation circuit thereof can switch off and on or modulate in selective manner the power supply to the fan motor 6 as delivered via the cable 18 as a function of a temperature signal coming from a temperature sensor 60 and conveyed via a cable 61 to the internal control circuit 71 of the extender plug 32. It is possible to provide a plurality of temperature sensors 60 located in different predetermined locations inside the microcomputer, with each sensor 60 being connected to the control circuit of the extender plug 32 via a respective cable 61.

One of the additional characteristics of the apparatus of the present invention lies in the fact that the temperature sensors 60 are preferably placed at a short distance from particular electronic components 62 which are selected as being components likely to overheat. The electronic component 62 that is likely to overheat may be one of the electronic components of one of the electronics cards 30 initially provided in the microcomputer 1, or it may equally well be an electrical or electronic device of any kind initially contained in the microcomputer 1. Moreover, the electronic component 62 that is likely to become hot may equally well be a particular component present on an additional electronics card designed to be added subsequently to a computer by being connected to the additional slot connectors 14 provided for this purpose. The control circuit 71 of the extender plug 32 is designed to control the power supply modulator circuit 72 of the fan motor 6 as a function of a value of the signal representative of the temperature picked up by the temperature sensor(s) 60.

In a first variant, the extender plug 32 may provide on/off control or fast/slow control of the fan motor 6 depending on whether the temperature picked up is greater than or less than a predetermined threshold. In another variant, the extender plug 32 may also issue a light or sound signal constituting an alarm when the sensed temperature exceeds the same predetermined threshold or exceeds another predetermined threshold. In yet another variant, the extender plug 32 may control a power supply voltage for the fan motor 6 in such a manner that it applies a predetermined or adjustable mathematical relationship which may be linear or non-linear as a function of the signal representative of the temperature sensed by the temperature sensor(s) 60 located at a predetermined location inside the microcomputer.

Consequently, the extender plug 32 and the various sensors 60 connected thereto together constitute a system serving both to reduce the sound level of the microcomputer 1 in part, at least during most of the time it is in operation, and to establish a system for regulating the amount of cooling applied to the microcomputer, not as a function of the general temperature inside the microcomputer, but as a function of the temperature that obtains at predetermined particular points of said microcomputer, which particular points may be selected differently depending on the different electronics cards that have subsequently been added to the microcomputer. This makes it possible to increase the operating reliability of the microcomputer when its configuration is modified by anybody taking action subsequent to its manufacture, e.g. a user, a dealer, or a person performing maintenance.

Figure 4:
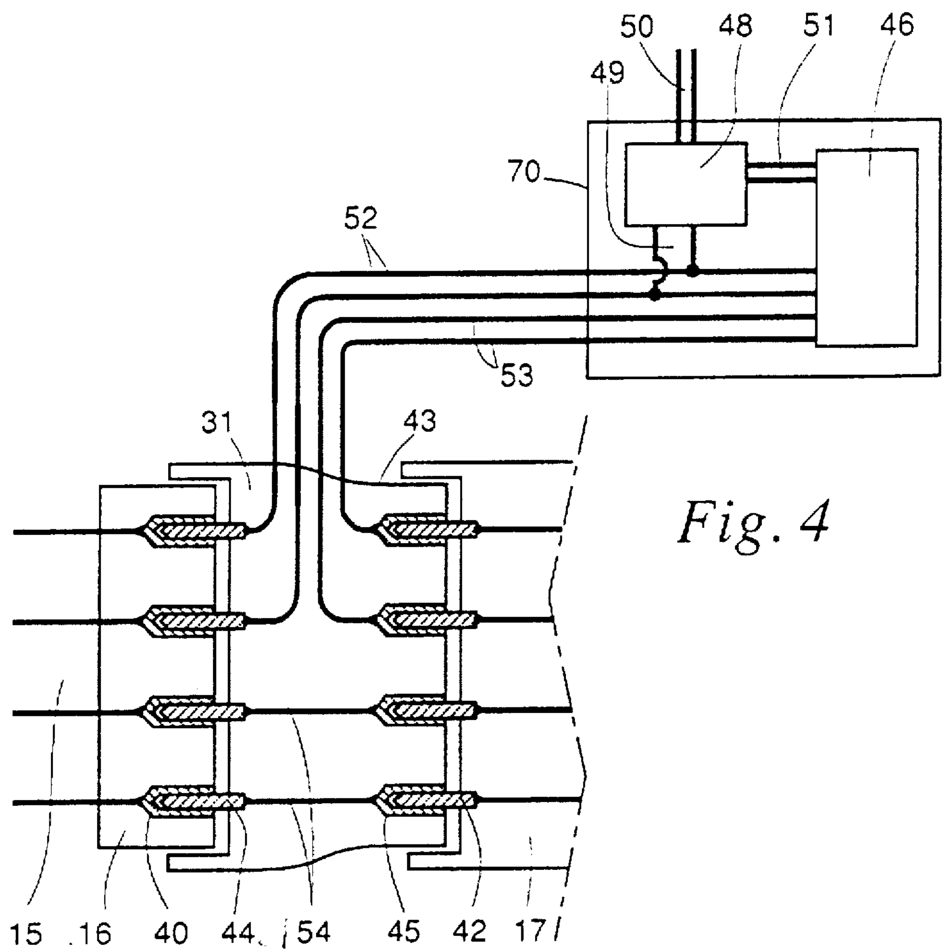
FIG. 4 is a view similar to FIG. 3 but showing a variant embodiment of the first essential element (type 1 unit) of the apparatus of the present invention.

FIG. 4 shows a variant embodiment for the extender plug 32 in which the power supply modulator circuit 46 and the control circuit 48 are housed in a housing 70 that is separate from the housing 43 of the extender plug 31, with the housing 70 being connected to the housing 43 by a cable which includes the electric connections 52 and 53 connecting some of the male contacts 44 and the corresponding female contacts 45 to the housing 70. This structure enables the housing of the extender plug 31 to be made more compact if that turns out to be necessary or preferable.

Similarly, FIG. 6 shows a variant embodiment of the extender plug 32 in which the power supply modulator circuit 78 and the control circuit 71 are in a housing 78 separate from the housing 79 of the extender plug 32, with the housing 78 being connected to the housing 79 by a cable that includes the electrical connections 73 and 76 which connect some of the female contacts 23 and the corresponding male contacts 24 to the housing 78. This structure makes it possible for the housing of the extender plug 32 to be made more compact if that should be necessary or preferable. In this embodiment described with reference to FIG. 6 in which it is possible to accommodating four temperature sensors 60, there are installed only three temperature sensors 60 connected via three cables 61, three female connectors 61C, the male connector 81, and the conductors 61A of the control circuit 71. The amount of cooling applied to the microcomputer is thus controlled as a function of the three temperatures picked up by the three temperature sensors 60. Also, it can be seen in FIG. 6 that the extender plug 32 is connected in releasable manner via a female connector 80 to the housing 78, thereby making it possible to connect a plurality of different types of connector 19 and 20 via a plurality of extender plugs 32 to a single type of housing 78. It is also possible to use an identical arrangement for the extender plug 31.

A second embodiment may be one in which the type 1 and the type 2 units are in the form of circuits (not shown) inserted respectively in the cables 15 and 18 after they have been sectioned completely or in part, with such a circuit not necessarily including connectors as shown for mating with the connector pairs 16/17 and 19/20 present in the microcomputer, but including, more generally, input contacts and output contacts which are designed in conventional manner to connect to the electric wires of the cables 15 and 18.

In this second embodiment, the type 1 units and the type 2 units are identical in structure and function to the structure and function of the type 1 units and type 2 units described for the first embodiment. In this second embodiment where the type 1 and the type 2 unit are present in the form of a circuit that is inserted on cable, it is possible to section only one of the two power supply wires in either of the cables 15 and 18 and to make contact with the other power supply wire via an insulation displacement or "vampire" contact that passes through the insulation of the wire to establish electric contact with sectioning the conductor of the second wire, or alternatively both power supply wires may be sectioned in either of the cables 15 or 18. The electric contacts between the wires of the cables and the circuit for insertion on the cable can be performed by conventional techniques such as: connectors, screw terminals, installation displacement connectors, soldering, crimping, self-locking terminals on bared conductor, etc.

Other embodiments include those in which some of the n type 1 units and the p type 2 units ($n \geqq 1$ and $p \geqq 1$) are implemented as extender plugs and others are implemented in the form of a cable insertion circuit for each unit.

Another feature of the present invention consists in mounting the temperature sensor at a specific location which is determined as follows. The general principle on which the specific location is determined consists in specifying that the sensor is to measure the temperature of air that comes from the outside and that has also been heated in part by the internal elements of the microcomputer. This partial heating corresponds to the following equation:

$$T_{mes}=T_{in}+k(T_{out}-T_{in})$$

where:

$T_{mes}$ is the temperature measured during operation of the microcomputer;

$T_{in}$ is the inlet temperature during normal operation of the microcomputer;

$T_{out}$ is the outlet temperature during normal operation of the microcomputer; and k is a predetermined constant lying in the range 0.1 to 0.5.

By operating in this way, an anticipation phenomenon occurs with respect to triggering of the fan in the event of abnormal heating of an internal component because of inlet air being at too high a temperature, and another phenomenon is also produced whereby account is taken directly of the heat given off by the machine as a whole.

The invention is not limited to the embodiments described above, and it extends to variants and modifications that are due to particular dispositions in the structure of computers. In particular, the cable 15 is not necessarily a cable but is often constituted by juxtaposing four independent wires that are all connected to the same connector. Similarly, the cable 18 is not necessarily a cable and is often constituted by juxtaposing two independent wires that are connected to the fan motor. Also, the power supply modulator circuits 46 and 72 can quite possibly provide on/off control of a single circuit only (by acting at any one point in the current loop).

Figure 8:
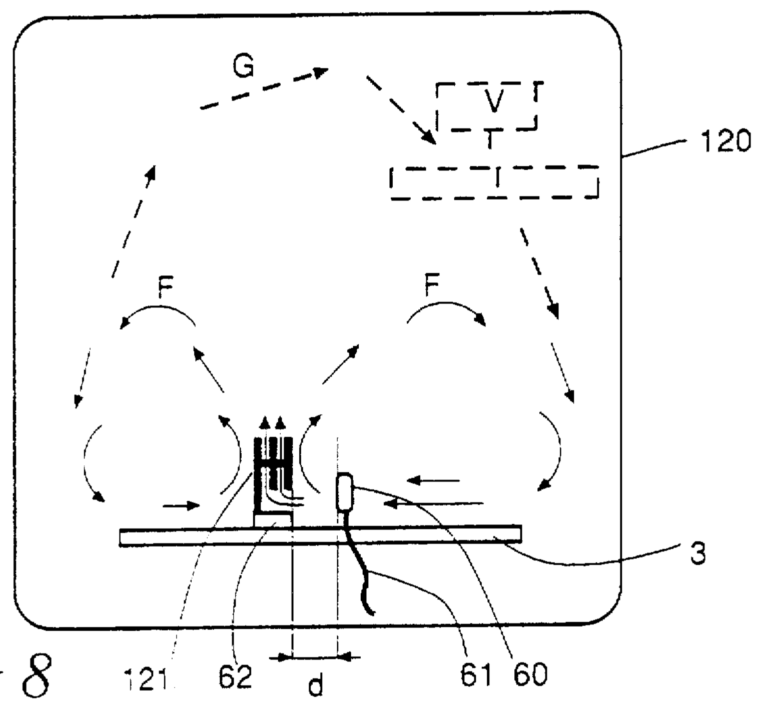
FIG. 8 is a simplified side view of the inside of a microcomputer for showing a location for a temperature sensor, which location is determined in application of another aspect of the present invention.
Figure 9:
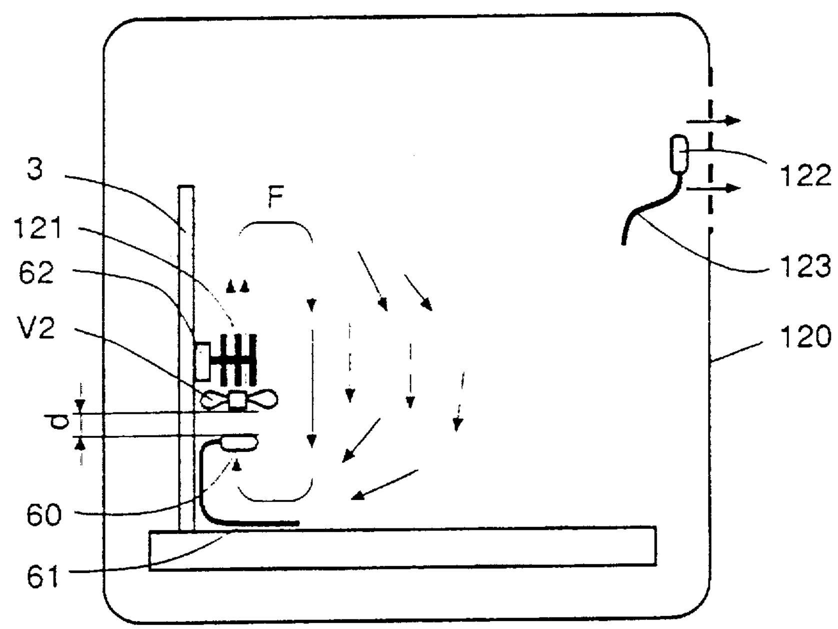
FIG. 9 is a simplified side view of the inside of a microcomputer for showing another location of a temperature sensor, which location is determined in application of yet another aspect of the present invention.

FIGS. 8 and 9 show the inside of a microcomputer so as to show the locations of the temperature sensors, which locations are determined in application of another aspect of the present invention. In FIG. 8, there can be seen the outer box 120 of a microcomputer that includes an electronics card 3 which is disposed horizontally and on which there is a component 62 that is liable to heat up abnormally and which is provided with a radiator 121. The component is cooled by natural convection (arrows F) or, in a variant, by forced air flow obtained by a fan V that is relatively remote from the component 62 (e.g. more than 3 cm away therefrom (fan V shown in dashed lines generating air circulation represented by dashed arrows G)). In all these circumstances, in another aspect of the present invention, provision is made to place the sensor 60 upstream from the component 62 and its radiator 121 relative to the cooling air flow direction reaching the component 62 (or its radiator 121), and at a distance "d" from the component 62 (or its radiator 121) lying in the range 2 mm to 25 mm, and preferably in the range 5 mm to 20 mm. Numerous experiments have been performed by the inventor and they have led to this specification which can be explained as follows. The sensor 62 thus detects the temperature of the air which is about to cool the component but it does so at a location where said air has already been subjected to a certain amount of short term heating due directly to the component (because of the relatively small distance "d"). This short term or fast partial heating may be due, according to our analysis, to certain parasitic movements of the air in the vicinity of the component, and/or to an effect of direct infrared radiation from the component or its radiator.

In FIG. 9, the card 3 is disposed vertically, but that is not essential. Also, the radiator 121 of the component 62 is cooled by an adjacent microfan V2 which is situated at less than 10 mm from the radiator. In this case, the recommended distance "d" of our invention is measured between the upstream end of the fan V2 and the sensor 60. In this case, the distance "d" lies in the range 0 to 20 mm, and preferably in the range 0 to 10 mm. The sensor 60 is always situated upstream from the radiator 121 or the component 62 relative to the displacement direction of the cooling air reaching the radiator or the component. Also, provision is made for another sensor 122 which measures air leaving the microcomputer and consequently air which has been generally heated in a manner that is arranged over space and time by a large number of internal sources of heat in the microcomputer. In this case, a fan is controlled to increase its speed if one or other of the sensors 60 and 122 (or both simultaneously) exceeds its respective predetermined temperature threshold. From numerous experiments performed by the inventor, this method of controlling the fan makes it possible to limit sound nuisance as much as possible while avoiding taking any risk of a component becoming too hot.

Figure 10:
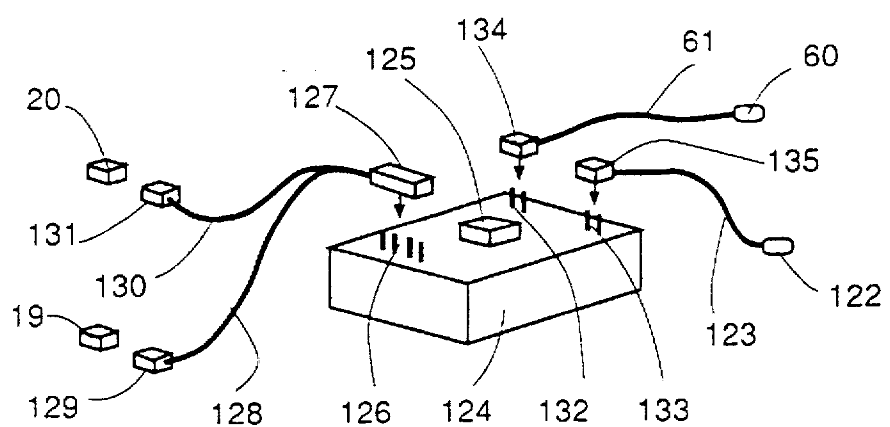
FIG. 10 is a perspective view of a preferred embodiment of a unit in accordance with the present invention.

In FIG. 10, there can be seen another preferred embodiment of the invention. A unit performing the same function as the unit 31 or 32 described above is shaped differently as described below. The unit comprises a housing 124 which includes a twin male connector 126 (whose function is described below), a warning device 125, and two other male connectors 132, 133 (whose function is described below). The housing contains all of the electronic control functions (for the fan or the disk) as described above with reference to the units 31 or 32. The difference lies in the way in which the housing 124 is connected to the other elements of the microcomputer. In this case, the female connector 19 (FIG. 2) is connected to a male connector 129 which is connected to the housing 124 via a cable 128 and a twin female connector 127 itself connected to the twin male connector 126. The male connector 20 (FIG. 2) is connected to a female connector 131 which is connected to the housing 124 via a cable 130 and the twin female connector 127 itself connected to the twin male connector 126. The electrical power supply from 120 powers the control electronics contained in the housing 124 via 131, 130, 127, and 126, and electrical power is delivered in modulated manner from said electronics to the connector 19 of a fan motor 6 (FIG. 2) via 126, 127, 128, and 129. In addition, sensors 60 (FIG. 2) and 122 (FIG. 8) are connected to the electronics contained in the housing 124 via cables 61, 123, female connectors 134, 135, and respective male connectors 132, 133 mounted on the housing 124. In this manner, it is possible to locate the housing 124 at any location inside the microcomputer.

I claim:

1. A method of reducing the sound level of a microcomputer, the microcomputer including:

at least one fan rotated by a fan motor, at least one component that gives off heat at a rate that varies as a function of the operating conditions of the at least one component, a power supply for electrically powering the fan motor, at least one first electric cable connecting the power supply to the fan motor either directly or via both a first connection element and a second connection element releasably engageable with the first connection element and connected to the fan motor;

the method comprising the following steps:

a) providing at least one unit of a first type including input and output contacts suitable for being connected in releasable and interposed manner either to the at least one first cable or between the first connection element and the second connection element and which includes:

a first power supply modulator circuit controlled as a function of a first control signal so as to interrupt, establish, or modulate in selective manner the power supply to the fan motor via certain input contacts and output contacts of the at least one unit of the first type; and a first control circuit which is continuously powered by the power supply via the input contacts of the at least one unit of the first type, which receives, via at least one temperature signal cable, at least one temperature signal produced by at least one first temperature sensor situated at a certain distance from said at least one component that gives off heat, and which produces as an output said first control signal for controlling the first power supply modulator circuit so that the first control signal:

either causes the fan motor to be powered when said at least one temperature signal is in a state indicative of excessive temperature and causes the power supply to the fan motor to be interrupted or reduced when said at least one temperature signal is in a state indicative of non-excessive temperature;

or else modulates the power supply to the fan motor in application of a predetermined mathematical relationship as a function of the at least one temperature signal;

b) connecting the at least one unit of the first type to the at least one first cable by sectioning it in full or in part, or connecting the at least one unit of the first type between the first and second connection elements; and c) placing in the microcomputer said at least one first temperature sensor for said at least one unit of the first type.

2. A method according to claim 1, wherein step c) of positioning said at least one first temperature sensor includes positioning said at least one first temperature sensor upstream from said at least one component that gives off heat in the flow direction obtained by natural convection or by non-adjacent forced ventilation of air for cooling the at least one component, the distance between said at least one first temperature sensor and said at least one component lying in the range 5 mm to 20 mm.

3. A method according to claim 2, wherein said step c) of positioning said at least one first temperature sensor includes further positioning a second temperature sensor in the flow of cooling air at a location where said air leaves the microcomputer after sweeping over a set of components of the microcomputer and thus after being heated by receiving heat that has been accumulated by said set of components.

4. A method according to claim 3, wherein said at least one fan is controlled in such a manner as to increase its speed when said at least one first temperature sensor detects a temperature greater than a first predetermined threshold OR when said second temperature sensor detects a temperature greater than a second predetermined threshold, said "OR" condition being a logical inclusive-OR function.

5. A method according to claim 1, wherein step c) of positioning said at least one first temperature sensor includes positioning said at least one first temperature sensor upstream from said at least one component that gives off heat in the flow direction obtained by forced ventilation of cooling air for the at least one component caused by an adjacent fan organized specifically for said at least one component and situated very close thereto, the distance between said at least one first temperature sensor and said adjacent fan lying in the range 0 to 10 mm.

6. A method according to claim 1, in which said microcomputer further includes:

at least one hard disk rotated by a disk motor, at least one electrical circuit including at least one output terminal producing a disk operation request signal, the power supply electrically powering the motor of the at least one hard disk, at least one second electrical cable connecting the power supply to the disk motor either directly or via both a third connection element and a fourth connection element releasably engageable with the third connection element and connected to the disk motor;

wherein said step a) further comprises:

providing at least one unit of a second type including input and output contacts suitable for being connected in releasable and interposed manner either to the at least one second cable or between the third connection element and the fourth connection element and which includes:

a second power supply modulator circuit controlled as a function of a second control signal so as to interrupt, establish, or modulate in selective manner the electrical power supply for the disk motor via certain input and output contacts of the at least one unit of the second type; and a second control circuit which is continuously powered by the power supply via the input contacts of the at least one unit of the second type, which receives an operation request signal via an operation request signal cable and which outputs said second control signal to control the second power supply modulator circuit in such a manner that the second control signal causes the disk motor to be powered throughout all the time the operation request signal is in a state indicative of an operation request, and causes the power supply to the disk motor to be interrupted or reduced when the operation request signal has remained in a state indicative of absence of an operation request for a length of time that exceeds a predetermined value, that is user or automatically adjustable; and wherein the method further includes the following steps:

d) connecting the at least one unit of the second type to the at least one second cable by sectioning said at least one second cable completely or in part, or connecting said at least one unit of the second type between the third and fourth connection elements; and e) engaging the at least one operation request signal cable for the at least one unit of the second type.

7. Apparatus for reducing the sound level of a microcomputer, the microcomputer including:

at least one fan rotated by a fan motor, at least one component that gives off heat at a rate that varies as a function of the operating conditions of the at least one component, a power supply for electrically powering the fan motor, at least one first electric cable connecting the power supply to the fan motor either directly or via both a first connection element and a second connection element releasably engageable with the first connection element and connected to the fan motor;

the apparatus comprising:

at least one unit of a first type including input and output contacts suitable for being connected in releasable and interposed manner either to the at least one first cable or between the first connection element and the second connection element and which includes:

a first power supply modulator circuit controlled as a function of a first control signal so as to interrupt, establish, or modulate in selective manner the power supply to the fan motor via certain input contacts and output contacts of the at least one unit of the first type; and a first control circuit which is continuously powered by the power supply via the input contacts of the at least one unit of the first type, which receives, via at least one temperature signal cable, at least one temperature signal produced by at least one first temperature sensor situated at a certain distance from said at least one component that gives off heat, and which produces as an output said first control signal for controlling the first power supply modulator circuit so that the first control signal:

either causes the fan motor to be powered when said at least one temperature signal is in a state indicative of excessive temperature and causes the power supply to the fan motor to be interrupted or reduced when said at least one temperature signal is in a state indicative of non-excessive temperature;

or else modulates the power supply to the fan motor in application of a predetermined mathematical relationship as a function of the at least one temperature signal; said at least one unit of the first type being for connection to the at least one first cable by sectioning it in full or in part, or for connection between the first and second connection elements; and said at least one first temperature sensor for said at least one unit of the first type being for installation in said microcomputer.

8. Apparatus according to claim 7, wherein said at least one first temperature sensor is positioned upstream from said at least one component that gives off heat in the flow direction obtained by natural convection or by nonadjacent forced ventilation of air for cooling the at least one component, the distance between said at least one first temperature sensor and said at least one component lying in the range 5 mm to 20 mm.

9. Apparatus according to claim 7, wherein said at least one first temperature sensor is positioned upstream from said at least one component that gives off heat in the flow direction obtained by forced ventilation of cooling air for the at least one component caused by an adjacent fan organized specifically for said at least one component and situated very close thereto, the distance between said at least one first temperature sensor and said adjacent fan lying in the range 0 to 10 mm.

10. Apparatus according to claim 7, wherein a second temperature sensor is positioned in the flow of cooling air at a location where said air leaves the microcomputer after sweeping over a set of components of the microcomputer and thus after being heated by receiving heat that has been accumulated by said set of components.

11. Apparatus according to claim 10, wherein said at least one fan is controlled in such a manner as to increase its speed when said at least one first temperature sensor detects a temperature greater than a first predetermined threshold OR when said second temperature sensor detects a temperature greater than a second predetermined threshold, said "OR" condition being a logical inclusive-OR function.

12. Apparatus according to claim 7, in which said microcomputer further includes:

at least one hard disk rotated by a disk motor, at least one electrical circuit including at least one output terminal producing a disk operation request signal, the power supply electrically powering the motor of the at least one hard disk, at least one second electrical cable connecting the power supply to the disk motor either directly or via both a third connection element and a fourth connection element releasably engageable with the third connection element and connected to the disk motor;

the apparatus further comprising:

at least one unit of a second type including input and output contacts suitable for being connected in releasable and interposed manner either to the at least one second cable or between the third connection element and the fourth connection element and which includes:

a second power supply modulator circuit controlled as a function of a second control signal so as to interrupt, establish, or modulate in selective manner the electrical power supply for the disk motor via certain input and output contacts of the at least one unit of the second type; and a second control circuit which is continuously powered by the power supply via the input contacts of the at least one unit of the second type, which receives an operation request signal via an operation request signal cable and which outputs said second control signal to control the second power supply modulator circuit in such a manner that the second control signal causes the disk motor to be powered throughout all the time the operation request signal is in a state indicative of an operation request, and causes the power supply to the disk motor to be interrupted or reduced when the operation request signal has remained in a state indicative of absence of an operation request for a length of time that exceeds a predetermined value, that is user or automatically adjustable; and the at least one unit of the second type is being connected to the at least one second cable by sectioning said cable completely or in part, or being connected between the third and fourth connection elements.

13. Apparatus according to claim 12, wherein said second control circuit receives said operation request signal via said operation request signal cable and via a connector connectable to a connection element initially existing in the microcomputer.

14. Apparatus according to claim 12, wherein said at least one unit of the second type and said at least one unit of the first type are disposed in a single package to constitute said apparatus in the form of a kit designed to be used to reduce the sound level of a microcomputer.

15. Apparatus according to claim 14, wherein said at least one unit of the second type or its set of connectors is disposed in a plurality of models in said single package, said models differing from one another by the configurations of said input and output contacts of said at least one unit of the second type, whereby said plurality of models covers a plurality of different possible standard types of said third and fourth connection elements.

16. Apparatus according to claim 14, wherein said at least one unit of the first type or its set of connectors is disposed in a plurality of models in said single package, said models differing from one another by the configurations of said input and output contacts of said at least one unit of the first type, whereby said plurality of models covers a plurality of different possible standard types of said first and second connection elements.

17. Apparatus according to claim 12, wherein said at least one unit of the second type is implemented as a molded plastics housing supporting said input and output contacts of said at least one unit of the second type on two respective opposite faces and simultaneously enclosing said second power supply modulator circuit, said second control circuit, and various electrical connections established between said second power supply modulator circuit, said second control circuit and said input and output contacts of said at least one unit of the second type.

18. Apparatus according to claim 7, wherein said at least one unit of the first type is implemented as a molded plastics housing supporting said input and output contacts of said at least one unit of the first type on two respective opposite faces and simultaneously enclosing said first power supply modulator circuit, said first control circuit, and various electrical connections established between said first power supply modulator circuit, said first control circuit and said input and output contacts of said at least one unit of the first type.

* * * * *